United States Patent
Miura

(10) Patent No.: US 7,938,526 B2
(45) Date of Patent: *May 10, 2011

(54) PATTERN FORMING METHOD, DROPLET DISCHARGING DEVICE AND CIRCUIT MODULE

(75) Inventor: Hirotsuna Miura, Fujimi (JP)

(73) Assignee: Seiko Epson Corporation, Tokyo (JP)

( * ) Notice: Subject to any disclaimer, the term of this patent is extended or adjusted under 35 U.S.C. 154(b) by 1050 days.

This patent is subject to a terminal disclaimer.

(21) Appl. No.: 11/739,623

(22) Filed: Apr. 24, 2007

(65) Prior Publication Data

US 2007/0252882 A1  Nov. 1, 2007

(30) Foreign Application Priority Data

Apr. 27, 2006  (JP) ................. 2006-124095
Feb. 13, 2007  (JP) ................. 2007-032513

(51) Int. Cl.
  *B41J 2/01* (2006.01)
  *B41J 2/435* (2006.01)
  *B41J 27/00* (2006.01)

(52) U.S. Cl. .................. 347/102; 347/224; 347/257

(58) Field of Classification Search .......... 347/224, 347/102, 257
See application file for complete search history.

(56) References Cited

U.S. PATENT DOCUMENTS

| 6,509,960 B2 * | 1/2003 | Johnson et al. ............ 356/72 |
| 2003/0062185 A1 * | 4/2003 | Hammond et al. ......... 174/52.1 |
| 2003/0222961 A1 * | 12/2003 | Nakajima .................. 347/102 |
| 2004/0226929 A1 * | 11/2004 | Miura et al. .............. 219/121.85 |
| 2005/0012778 A1 | 1/2005 | Nishino et al. |
| 2007/0076077 A1 * | 4/2007 | Miura ....................... 347/102 |
| 2007/0076078 A1 | 4/2007 | Iwata et al. |
| 2007/0273739 A1 * | 11/2007 | Rodin et al. ................ 347/102 |

FOREIGN PATENT DOCUMENTS

| JP | 11-077340 | 3/1999 |
| JP | 11-320856 | 11/1999 |
| JP | 2003-127537 | 5/2003 |
| JP | 2003-237217 | 8/2003 |
| JP | 2004-209705 | 7/2004 |
| JP | 2005-057139 | 3/2005 |
| JP | 2005-095849 | 4/2005 |
| JP | 2006-247622 | 9/2006 |
| JP | 2006-272191 | 10/2006 |
| JP | 2006-276509 | 10/2006 |

* cited by examiner

*Primary Examiner* — Stephen D Meier
*Assistant Examiner* — Sarah Al-Hashimi
(74) *Attorney, Agent, or Firm* — Workman Nydegger

(57) ABSTRACT

A method of forming a pattern including: discharging a droplet of a pattern forming material onto a substrate; drying the droplet that has landed on the substrate; and forming a pattern on the substrate, the drying comprising: irradiating a region of the droplet with a laser beam launched by a laser source; and reflectively irradiating the region of the droplet again with the portions of the laser beam that have been either reflected or scattered from the region of the droplet.

8 Claims, 4 Drawing Sheets

PATTERN FORMING METHOD, DROPLET DISCHARGING DEVICE AND CIRCUIT MODULE

BACKGROUND OF THE INVENTION

The entire disclosures of Japanese Patent Application No. 2006-124095, filed Apr. 27, 2006, and Japanese Patent Application No. 2007-032513, filed Feb. 13, 2007, are expressly incorporated herein by reference.

1. Technical Field

The present invention relates to pattern forming. More specifically, the present invention relates to a method a forming a pattern, a droplet discharging device and a circuit module.

2. Related Art

Recently there have been circuit modules developed which include mounted electronic components, including semiconductor elements, such as a Low Temperature Co-fired Ceramics (LTCC) multilayer board made of a glass ceramics. Within the circuit modules, the LTCC multilayer board can be fabricated by firing stacked-up green sheets at temperatures of 900° C. or less. Within the boards, low melting metals such as silver and gold can be used for internal wiring, thereby simplifying the internal wiring process.

During the manufacturing process of such LTCC multilayer boards, a metal paste or a metal ink is used to write wiring patterns on each green sheet before it is stacked. One proposed method of writing is found in Japanese Patent Application JP-A-2005-57139 where an inkjet method is used wherein metal ink is discharged in the form of micro droplets. The inkjet method writes wiring patterns by joining such micro droplets. One advantage of this method is the quick response to changes in the design of the internal wiring, such as changes to the density of the internal wiring and changes to the width and pitch of the internal wiring.

One difficulty of the inkjet method is that the size and form of each droplet that lands on the green sheet changes with time according to the surface state of the green sheet and the surface tension of the droplet. The variations in the droplet size and form also vary in accordance with the timing of its drying. For example, a metal ink droplet with an external diameter of 30 μm expands to a diameter of 70 μm in 100 msec after landing on the lyophilic green sheet. The external diameter further expands to 100 μm 200 msec after landing. Thus, in this example, when the timing for drying of the droplet varies within the range of 100 msec to 200 msec after its landing, the width of the corresponding wiring pattern will vary within the range of 70 μm to 100 μm.

It has been proposed to use irradiated laser beams to dry such droplets, in order to minimize the variations in the size of the pattern. In the laser drying methods, only the droplets within the region irradiated by laser beams are dried. Therefore, the laser drying methods allow a highly precise control in the timing of drying of the droplets, resulting in a reduction of variation in the pattern size.

One disadvantage of the laser drying methods, however, is that in order to secure the placement of the droplets, the space between a droplet discharging head and an discharging target is often reduced to the level of several hundred micrometers. Thus, in the case where the droplets need to be dried right beneath the droplet discharging head, the laser beam must be irradiated into the narrow space between the droplet discharging head and the target of discharging from an angle that often makes it difficult to tightly focus the beam. As a result, the laser beam spot formed on the target is often large, preventing the sufficient amount of laser beam strength which is required for drying the droplets. This tends to result in insufficiently dried droplets, thereby incurring cases of poorly formed patterns.

BRIEF SUMMARY OF THE INVENTION

One advantage of the present invention is to provide a method of forming a pattern, a droplet discharging device, and a circuit module that allow droplets to be dried more efficiently and, thus, improve the pattern formation process.

One aspect of the present invention relates to a method of forming a pattern comprising discharging droplets of a pattern forming material onto a substrate and drying the droplets that have landed on the substrate so that they form a pattern on the substrate. The drying process includes: irradiating a laser beam launched by the laser source onto the region of the droplets; and reflectively irradiating the portions of the laser beam that have been either reflected or scattered from the region of the droplets back onto the region of the droplets again.

During the method of forming the pattern, portions of the laser beam that are either reflected or scattered from the region of the droplets and then reflectively irradiated back onto the region of the droplets again. Therefore, the method provides a more efficient method of drying the droplets, thereby preventing the droplets from being insufficiently dried and, thus, eliminating cases of poor formation of patterns.

Another aspect of the present invention relates to a droplet discharging device that has a droplet discharging head that discharges droplets of a pattern forming material onto a substrate. The droplet discharging device comprises: a first irradiation means that irradiates a laser beam launched by a laser source onto the region of droplets having landed on the substrate; and a second irradiation means that reflectively irradiates portions of the laser beam that have been either reflected or scattered from the region of the droplets back onto the region of the droplets again.

Yet another aspect of the present invention relates to a circuit module including a substrate, with the circuit elements and the metal wirings being formed on the substrate and electrically connected, the metal wirings having been formed by the droplet discharging head described above.

These and additional features of the invention will be set forth in the description which follows, and in part will be obvious from the description, or may be learned in the practice of the invention. The features and advantages of the invention may be realized and obtained by means of the instruments and combinations particularly pointed out in the appended claims. These and other features of the present invention will be more fully apparent from the following description and appended claims, or may be learned by the practice of the invention as set forth hereafter.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Figure 1:
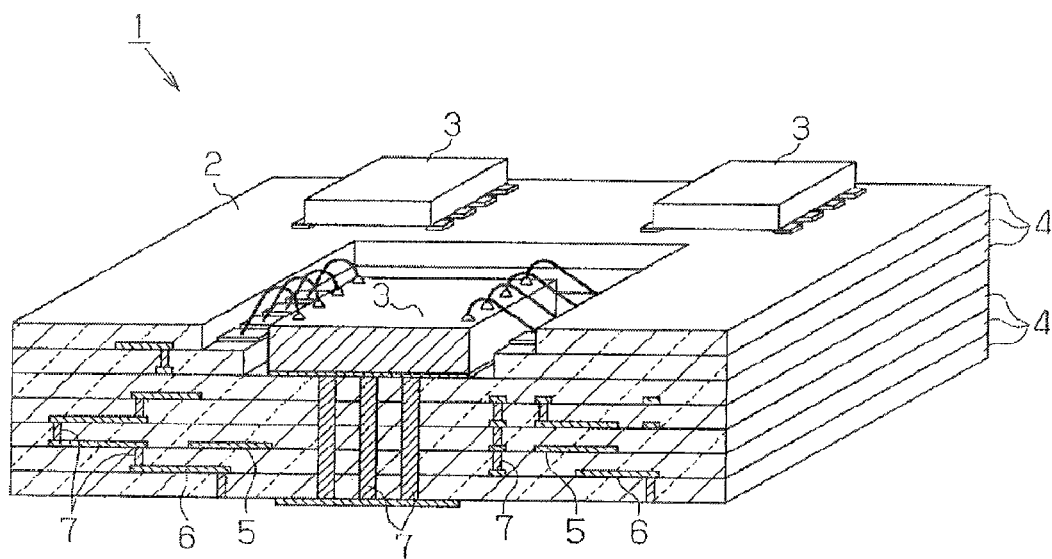
FIG. 1 is a perspective view that shows a circuit module according to one embodiment of the invention.

Referring to FIGS. 1 through 7, embodiments of the invention will now be described. First, a circuit module 1 according to an embodiment will be described. The circuit module 1 includes an LTCC multilayer board 2 formed in the shape of a plate and a plurality of semiconductor chips 3 that are connected by either wire bonding or flip-chips on the top surface of the LTCC multilayer board 2.

The LTCC multilayer board 2 includes a plurality of low temperature co-fired ceramics substrates (hereinafter referred to simply as the insulating layers 4) each of which is formed in the shape of a sheet and stacked up together to form the board. Each of the insulating layers 4 is a fired body made of a glass ceramics material (e.g. a mixture of a glass element such as borosilicate alkali oxide and a ceramics element such as alumina) and is formed in such a manner as to have a thickness of several hundred micrometers.

Between each of the insulating layers 4, various types of circuit elements 5 including resistance elements, capacitance elements, coil elements, and the like, are formed as well as a plurality of internal wirings 6 that are in the form of metal wirings that electrically connect each of the circuit elements. The circuit elements 5 and the internal wirings 6 are each a fired body that is made of fine particles of a metal such as silver or a silver base alloy and formed in using the droplet discharging device 10 according to one embodiment of the invention. Inside each insulating layer 4, via wirings 7 of a stack via structure or a thermal via structure are formed for electric inter-layer connection between each of the circuit elements 5 and the internal wirings 6. Each of the via wirings 7 is a fired body made of fine particles of a metal such as silver or a silver base alloy, as in the case of the circuit elements 5 and the internal wirings 6.

Figure 2:
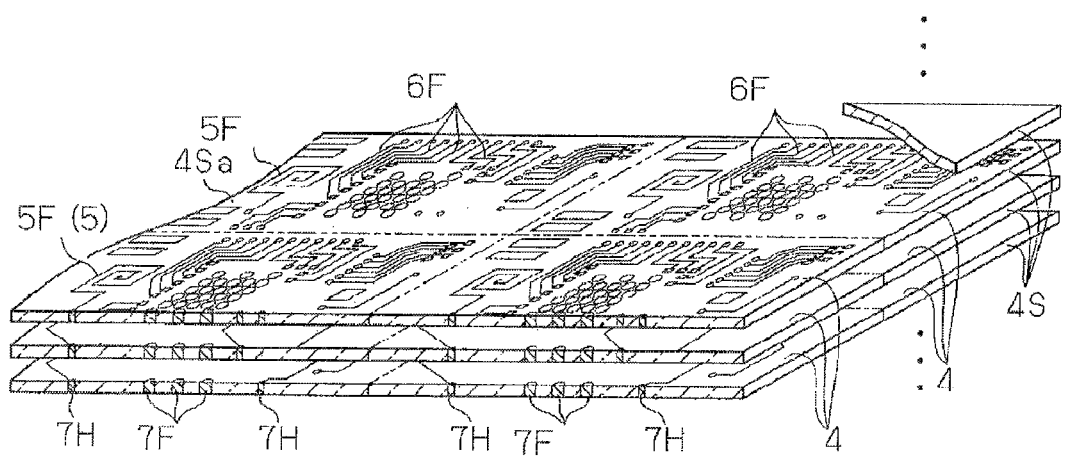
FIG. 2 is a illustration of a method for manufacturing a circuit module according to one embodiment of the invention.

Next, referring to FIG. 2, a method for manufacturing the LTCC multilayer board will be described. As shown in FIG. 2, green sheets 4S serve as substrates that render the insulating layers 4 ready to be cut are either punched or laser-processed to form via holes 7H. Then, screen printing using a metal paste is performed a plurality of times onto the green sheets 4S to fill in the via holes 7H with the metal paste, thus forming via patterns 7F made of the metal paste. Then, inkjet printing is performed on the top surfaces (hereinafter referred to simply as the pattern forming surfaces 4Sa) of the green sheets 4S by means of a metal ink F (a water-soluble silver ink is used in the present embodiment) that serves as a pattern forming material made of a soluble material in which nanoparticles of the metal are dispersed.

To describe more specifically, droplets Fb of the metal ink F are discharged onto the regions of the pattern forming surfaces 4Sa on which the circuit elements 5 and the internal wirings 6 are to be formed (hereinafter referred to simply as the pattern forming regions). The droplets, having landed on the pattern forming regions, are then dried. The discharging and drying actions are repeated to write the element patterns 5F and the wiring patterns 6F corresponding to the pattern forming regions. In the meantime, drying of the droplets Fb that have landed on the pattern forming regions is performed through irradiation of laser beams onto the droplets Fb.

When the element patterns 5F, wiring patterns 6F and via patterns have been formed on each of the green sheets 4S, a plurality of the green sheets 4S are lump-sum laminated, and the regions corresponding to the LTCC multilayer boards 2 are cut out as layered products to be fired. Namely, the green sheets 4S, the element patterns 5F, the wiring patterns 6F and the via patterns 7F are lump-sum laminated to be fired simultaneously. This allows the LTCC multilayer boards 2 having the insulating layers 4, circuit elements 5, internal wirings 6 and via wirings 7 to be formed.

Figure 3:
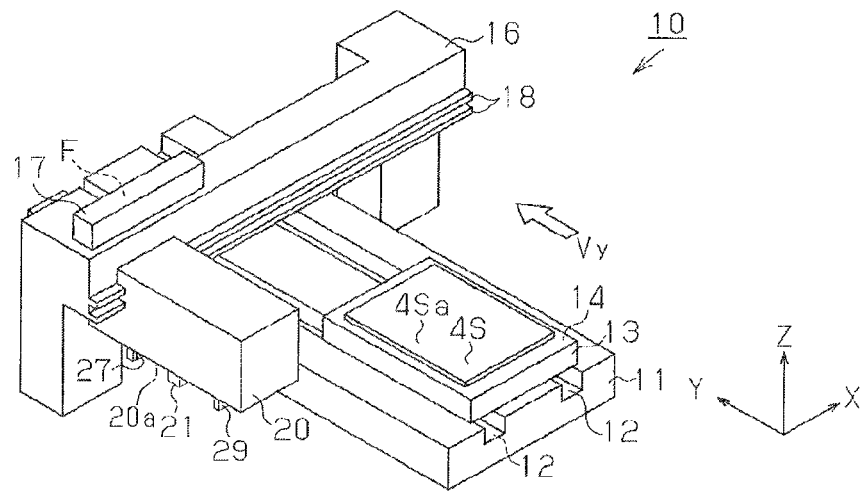
FIG. 3 is a perspective view that shows a droplet discharging device according to one embodiment of the invention.

Next, a droplet discharging device 10 for writing the element patterns 5F and wiring patterns 6F will be described with reference to FIG. 3. FIG. 3 is an overall perspective view that shows the droplet discharging device 10.

In FIG. 3, the droplet discharging device 10 includes a base 11 that is formed in the shape of a rectangular solid. A couple of guide grooves 12 are formed on the top surface of the base 11, along the length (direction Y) of the base 11. A stage 13, which serves as a scanner that moves along the guide grooves 12 in and against direction Y, is provided above the guide grooves 12. On the top surface of the stage 13, a mounting portion 14 is formed, on which a green sheet 4S is mounted with its pattern forming surface 4Sa facing upward. The mounting portion 14 locates and fixes the mounted green sheet 4S with respect to the stage 13 and carries the green sheet 4S in the Y direction. In the embodiment, Y direction is defined as the scanning direction and the velocity at which the green sheet 4S is carried along the scanning direction is defined as the scanning velocity Vy.

A guide member 16 is formed in the shape of a gate and is built on both sides of a base 11 in such a manner that it straddles the base 11 in direction that is orthogonal to the scan direction, known as the X direction, or X axis. An ink tank 17 is disposed on the guide member 16, extending in the X direction. The ink tank 17 stores a metal ink F and supplies the ink at respectively predetermined pressures to a droplet discharging head (hereinafter referred to simply as the discharging head) 21 disposed beneath the ink tank 17.

Figure 4:
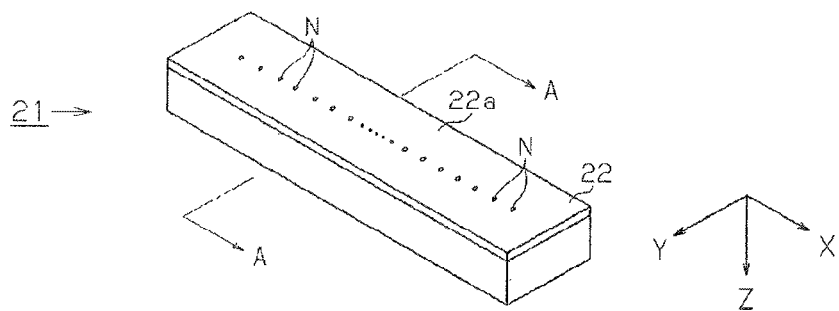
FIG. 4 is a perspective view that shows a droplet discharging head according to one embodiment of the invention.
Figure 5:
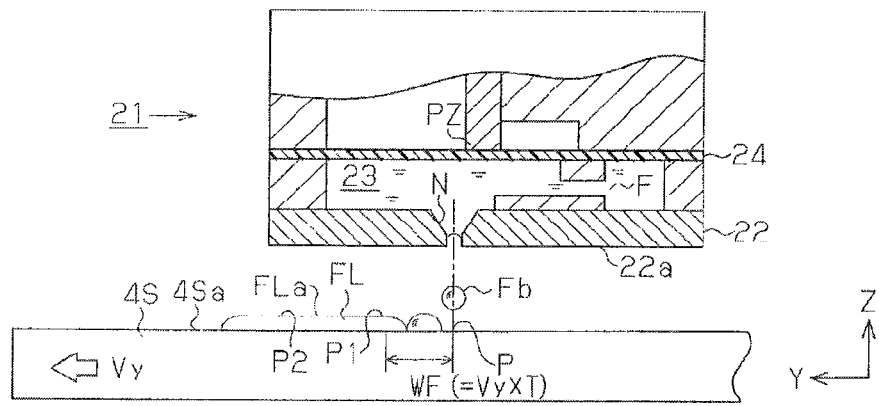
FIG. 5 is a side view that shows the droplet discharging head according to the embodiment of the invention.
Figure 6:
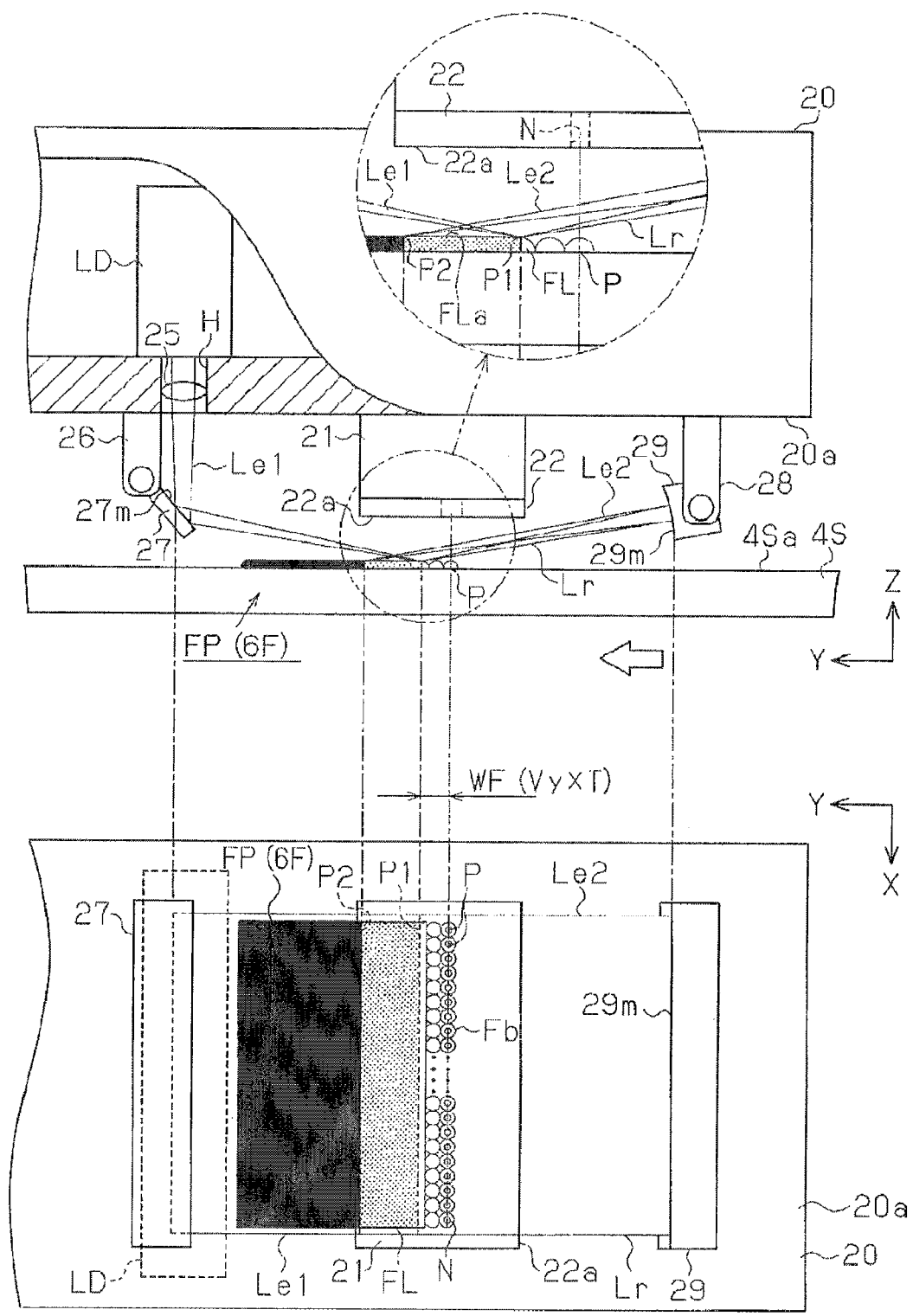
FIG. 6 is an illustration that explains the droplet discharging head and a semiconductor laser according to one embodiment of the invention.

A couple of upper and lower guide rails 18 are formed along the approximate entire width of the guide member 16 extending in the X direction. The guide rails 18 are mounted with a carriage 20 that moves along the guide rails 18 along the X axis. The discharging head 21 is mounted on the bottom surface 20a of the carriage 20, at approximately the center thereof. FIG. 4 is a perspective view that shows the discharging head 21 as observed from underneath (from the side of the green sheet 4S), and FIG. 5 is a sectional view of FIG. 4 as sectioned by line A-A. FIG. 6 is an illustration explaining the carriage 20.

In FIG. 4, the discharging head 21 is formed in the shape of a rectangular body extending in the X direction. On the bottom of the discharging head 21 (on the side thereof facing the green sheet 4S: on the upside thereof in FIG. 4), is a nozzle plate 22. The nozzle plate 22 is formed in the shape of a plate extending in the X direction, and a nozzle forming surface 22a is formed on the bottom surface of the plate (i.e. on the top surface in FIG. 4). The nozzle forming surface 22a is formed approximately parallel to the pattern forming surface 4Sa of the green sheet 4S, and the distance between the two surfaces is referred to as a platen gap, and is kept at a predetermined value (300 μm in the embodiment) when the green sheet 4S is beneath the discharging head 21. On the nozzle forming surface 22a, a plurality of nozzles N are disposed in an array along the X axis, the nozzles N being formed in a normal line to the forming surface 22a.

In FIG. 5, a cavity 23 is formed above each nozzle N, each cavity being in communication with the ink tank 17. The cavity 23 supplies a metal ink F from the ink tank 17 to the corresponding nozzle N. A diaphragm 24 is placed above each cavity 23 and is capable of vertically oscillating to expand and contract the volume inside the cavity 23. A plurality of piezoelectric elements PZ that correspond to the nozzles N are disposed on the diaphragm 24. Each of the piezoelectric elements PZ respectively contract and expand to vertically oscillate the region of the corresponding diaphragm 24, thereby discharging the metal ink F from the corresponding nozzle N in the form of a droplet having a predetermined volume (10 pl in this embodiment). The droplet Fb drops from the corresponding nozzle in the Z direction and lands on the pattern forming surface 4Sa facing the nozzle N. In the present embodiment, the droplets land in a position corresponding to the respective nozzles N, and are defined as a landing position P.

The droplets Fb having landed, spread on the pattern forming surface 4Sa while it is being moved in the scanning direction and, in time, joins other droplets Fb that have previously landed. The joining droplets Fb form a liquid film FL that spreads in the scanning direction and form a liquid level FLa, which is approximately parallel with the pattern forming surface 4Sa, over the entire top surface of the liquid film FL.

In the present embodiment, the time required for the droplets Fb to form the liquid film FL is defined as irradiation wait time T. Also, the distance over which the droplets Fb are spaced during the irradiation wait time T is defined as irradiation wait distance WF (=scan velocity Vy×irradiation wait time T).

In the present embodiment, the first distance WF of the liquid level FLa from the landing position P is defined as the first irradiated position P1. Furthermore, the second distance WF of the liquid level FLa from the landing position P is defined as the second irradiated position P2.

In FIG. 6, a launch hole H that extends through the inside of the carriage 20 is formed on the bottom surface 20a of the carriage 20, the hole being located a distance in the scanning direction (Y direction) from the discharging head 21. The launch hole H is formed in such a manner that its width along the X direction is approximately the same as the of the discharging head 21. A semiconductor laser LD that serves as the laser source is disposed above the launch hole H.

The semiconductor laser LD launches a swath of collimated laser beam downwards, the beam extending across the approximate full width of the launch hole H along the X direction. The wavelength of laser beams launched by the semiconductor laser LD is set within the range of the absorption wavelength of the metal ink F (808 nm in the embodiment).

A cylindrical lens 25 constituting a first irradiation means is disposed within the launch hole H. The cylindrical lens 25 is a lens having a curvature only in the Y direction. The width of the lens surface in the X direction is of the same size as the width of the discharging head 21. When the semiconductor laser LD launches a laser beam, the cylindrical lens 25 converges only those components of the beam in the Y direction, creating a laser beam in line with the scan direction, referred to as a first irradiation beam Le1.

Beneath the launch hole H, a first mirror stage 26 and a reflection mirror 27 that is pivotally supported by the first mirror stage 26 and constitutes the first irradiation means, are disposed. The first mirror stage 26 pivotally supports the reflection mirror 27 around a turn shaft that is disposed in line with the X direction.

The reflection mirror 27 is a planar mirror having a reflecting surface 27m on its side facing the cylindrical lens 25 and is formed in such a manner that the width of the reflecting surface 27m in the X direction is of the same size as the discharging head 21. When the semiconductor laser LD launches a laser beam, the reflection mirror 27 reflects the first irradiation beam Le1 from the cylindrical lens 25 along approximate tangential projection of the pattern forming surface 4Sa (approximately counter to the scanning direction). The reflection mirror 27 irradiates the first irradiation beam Le1 onto all of the first irradiated positions P1 so that the beam waist of the reflected first irradiation beam Le1 is the same for all of the first irradiated positions P1.

The first irradiation beam Le1 partly permeates the liquid level FLa, causing it to be absorbed by the liquid film FL, and starts drying the liquid film FL. Thus, the first irradiation beam Le1 has an enhanced permeating volume insomuch as it reaches the first irradiated positions P1 with its beam waist. Accordingly, the first irradiation beam Le1 absorbed by the liquid film FL is larger in amount, thereby enhancing the drying efficiency of the liquid film FL.

Meanwhile, the portion of the first irradiation beam Le1 irradiating the first irradiated positions P1 which is not absorbed by the liquid film FL, is reflected (or scattered) as scattered reflection from the first irradiated positions P1 in a direction that is approximately along the scanning or Y direction.

A second mirror stage 28 extends downwards from the carriage 20 and a concave mirror 29 as a mirror constituting a second irradiation means being pivotally supported by the mirror stage 28 are each disposed on the bottom surface 20a of the carriage 20 at some distance in the scan direction (Y direction) from the discharging head 21. The second mirror stage 28 pivotally supports the concave mirror 29 around the turn shaft that extends along the X direction.

The concave mirror 29 is a cylindrical mirror with a concave surface (reflective face 29m) having a curvature only in the Y direction, the concave surface facing toward the discharging head 21. The concave mirror 29 is formed in such a manner that its width in the X direction is approximately of the same size as the width of the discharging head 21. The reflective face 29m is a concave whose curvature radius is the distance between the second irradiated positions P2 and the reflective face 29m.

The concave mirror 29 receives the scattered reflection Lr from the first irradiated positions P1 when the semiconductor laser LD launches a laser beam Le1 and the droplet Fb forms the liquid film FL. The reflective face 29m of the concave mirror 29 reflects the scattered reflection Lr along a path that is tangential to the pattern forming surface 4Sa, which is approximately along the scanning direction, and converges it as the second irradiation beam Le2. The concave mirror 29 irradiates the second irradiation beam Le2 onto all of the second irradiated positions P2 so that the beam waist of the second irradiation beam Le2 extends to all of the second irradiated positions P2.

Part of the second irradiation beam Le2 permeates the liquid level FLa that has started drying and accelerates drying of the liquid film FL. In this embodiment, the second irradiation beam Le2 has an enhanced permeating volume insomuch as it reaches the second irradiated positions P2 with its beam waist. Thus, the second irradiation beam Le2 is absorbed more fully by the liquid film FL, thereby further improving the drying efficiency of the liquid film FL.

As a result, the liquid film FL (droplets Fb) is more fully dried as it is further irradiated by the scattered reflection Lr in the form of the second irradiation beam Le2, forming a layer pattern FP that is sufficiently dried. The element patterns 5F and the wiring patterns 6F are thus formed as such layer patterns FP are stacked up in order, resulting in an improved pattern formation.

Figure 7:
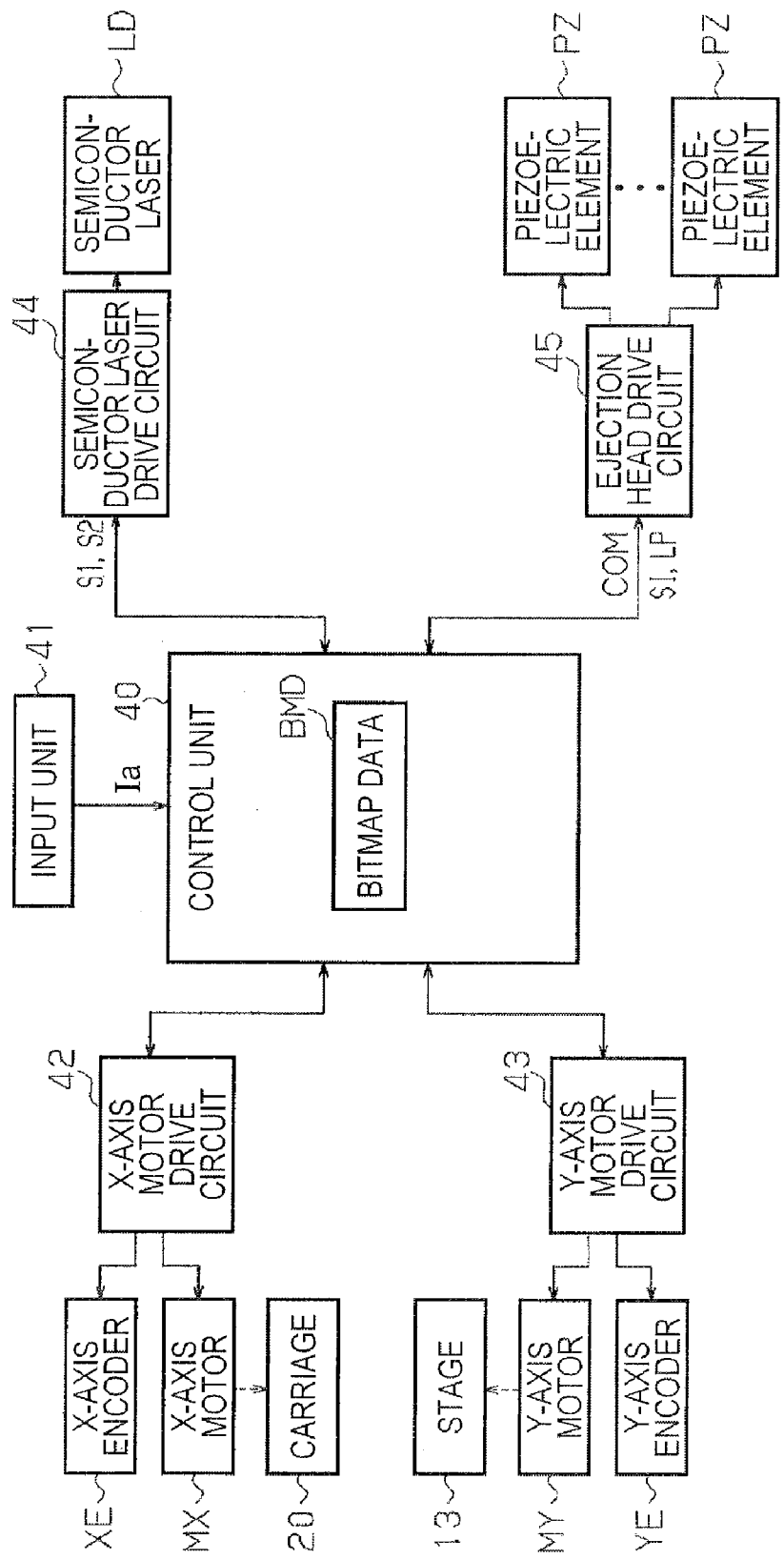
FIG. 7 is an electric block circuit diagram that explains the electric configuration of the droplet discharging device according to one embodiment of the invention.

Next, referring to FIG. 7, the electric configuration of the droplet discharging device 10 having a structure described above, will be described. In FIG. 7, the control unit 40 serving as a control medium includes a CPU, ROM, RAM and the like, and moves the stage 13 and the carriage 20 in accordance with various data and control programs stored within the CPU, ROM, RAM, or the like. At the same time, the control programs control the drive of the semiconductor laser LD and the piezoelectric elements PZ.

An input unit 41 is connected to the control unit 40 having operating switches including a start switch and a stop switch. The input unit 41 sends to the control unit 40 data concerning the position coordinate of a pattern forming region (layer pattern FP) with respect to the written plane (pattern forming surface 4Sa), the data being in the form of writing data Ia of a predetermined form. The control unit 40 receives the writing data Ia from the input unit 41 and creates bitmap data BMD.

The bitmap data BMD is data that prescribes the on or off of each piezoelectric element PZ in accordance with the value of each bit (either 0 or 1). The bitmap data BMD is data that prescribes whether or not to eject a droplet Fb onto each position on the writing plane (pattern forming surface 4Sa) above which the discharging head 21 passes through. Namely, the bitmap data BMD is for making each droplet to be discharged on each of the target positions prescribed on the pattern forming region.

The control unit 40 is connected to an X-axis motor drive circuit 42 and outputs drive control signals corresponding to the X-axis motor drive circuit 42. The X-axis motor drive circuit 42 responds to the drive control signals from the control unit 40 to normally and reversely rotate the X-axis motor MX that is designed to move the carriage. An X-axis encoder XE is connected to the X-axis motor drive circuit 42 and detection signals are inputted from the X-axis encoder XE. The X-axis motor drive circuit 42 creates signals concerning the direction and the distance of the carriage 20 (each landing position P) on the basis of detection signals from the X-axis encoder XE and outputs the signals to the control unit 40.

The control unit 40 is connected to a Y-axis motor drive circuit 43 and outputs drive control signals corresponding to the Y-axis motor drive circuit 43. The Y-axis motor drive circuit 43 responds to the drive control signals from the control unit 40 and normally or reversely rotates the Y-axis motor MY that is designed to move the stage 13. Namely, the control unit 40 scans the stage 13 (pattern forming surface 4Sa) by means of the Y-axis motor drive circuit 43 insomuch as the irradiation wait distance WF during the irradiation wait time T, thereby rendering the droplets Fb at the first irradiated positions P1 to form the liquid film FL.

The Y-axis motor drive circuit 43 is connected to a Y-axis encoder YE in order to receive detection signals from the Y-axis encoder YE. The Y-axis motor drive circuit 43 creates signals concerning the moving direction and moving distance of the stage 13 (pattern forming surface 4Sa) on the basis of the detection signals from the Y-axis encoder YE, and outputs the signals to the control unit 40. The control unit 40 computes relative positions of the landing positions P on the pattern forming surface 4Sa based on the signals from the Y-axis motor drive circuit 43 and outputs discharging timing signals LP every time the target position is at the corresponding landing position P.

The control unit 40 is connected to a semiconductor laser drive circuit 44 and outputs writing start signals S1 when a writing operation is started and outputs writing terminate signals S2 when the writing operation is terminated. The semiconductor laser drive circuit 44 inputs the writing start signals S1 from the control unit 40 and causes the semiconductor laser LD to launch a laser beam. It inputs the writing terminate signals S2 from the control unit 40 and causes the semiconductor laser LD to terminate launch of the laser beam. Namely, the control unit 40 controls drive of the semiconductor laser LD during a writing operation by means of the semiconductor laser drive circuit 44, and performs the irradiating operation of a laser beam.

The control unit 40 is connected to an discharging head drive circuit 45 and outputs a piezoelectric element drive voltage COM for driving each of the piezoelectric elements PZ, in synchronization with the discharging timing signals LP. Furthermore, the control unit 40 creates discharging control signals S1 synchronized with predetermined clock signals on the basis of the bit map data BMD and serially transfers the discharging control signals SI to the discharging head drive circuit 45. The discharging head drive circuit 45 serially/parallelly converts the discharging control signals SI from the control unit 40 in correspondence with each of the piezoelectric elements PZ. The discharging head drive circuit 45 latches the serially/parallelly converted discharging control signals SI every time it receives the discharging timing signals LP from the control unit 40, and supplies the piezoelectric element drive voltage COM respectively to selected piezoelectric element PZ.

Next, a method for writing the element patterns 5F and the wiring patterns 6F in using the droplet discharging device 10 will be described. First, as shown in FIG. 3, the green sheet 4Sa is mounted on the stage 13 in such a manner that the pattern forming surface 4Sa faces upwards. On this occasion, the stage 13 moves the green sheet 4S at along the scanning or Y direction.

In this state, the writing data Ia is inputted from the input unit 41 to the control unit 40 and the control unit 40 creates and stores the bitmap data BMD based on the writing data Ia. Then, the control unit 40 moves the carriage 20 (the discharging head 21) by means of the X-axis motor drive circuit 42 to a predetermined position so that the target positions passes over the corresponding landing positions P when the green sheet 4S is scanned. When the carriage 20 has been moved, the control unit 40 starts scanning the green sheet 4S by means of the Y-axis motor drive circuit 43.

When scanning of the green sheet 4S is initiated, the control unit 40 outputs discharging control signals SI created on the basis of the bitmap data BMD to the discharging head drive circuit 45.

At the same time, the control unit 40 outputs the discharging timing signals LP to the discharging head drive circuit 45 every time a target position is at a corresponding landing position P. Furthermore, every time the control unit 40 outputs the discharging timing signals LP, it selects a nozzle N for discharging of a droplet Fb based on the discharging control signals SI and discharges the droplet Fb at a landing position P corresponding to the selected nozzle N, i.e. the target position. Each discharged droplet Fb lands on a corresponding target position on the pattern forming surface 4Sa. The droplet Fb landing on each target position joins preceding droplets Fb near the first irradiated positions P1 to form the liquid film FL that extends in the scanning direction.

The control unit 40 also outputs the writing start signals S1 to the semiconductor laser drive circuit 44 to launch a laser beam from the semiconductor laser LD.

When the semiconductor laser LD has launched a laser beam, the reflection mirror 27 reflects the laser beam from the semiconductor laser LD as a first irradiation beam Le1 along approximately the same direction as the scanning direction in order to irradiate the first irradiated positions P1. The liquid film FL starts drying at the first irradiated positions P1 and partly transmits the first irradiation beam Le1 by reflecting or scattering the beam in the form of the scattered reflection Lr in approximately the opposite direction as the scanning direction.

When the liquid film FL has either reflected or scattered portions of the first irradiation beam Le1, the concave mirror 29 receives the scattered reflection Lr from the liquid film FL to reflects the beam as a second irradiation beam Le2 to irradiate the second irradiated position P2. The liquid film FL at the second irradiated position P2 absorbs portions the second irradiation beam Le2 and accelerates drying. As a result, the liquid film FL that has started drying by irradiation of the first irradiation beam Le1 dries more fully as it is irradiated again by the second irradiation beam Le2. Thus, a layer pattern FP that is sufficiently dry can be formed. Stacking up of such layer patterns FP in order allows the element patterns 5F and the wiring patterns 6F to be formed with improved certainty Next, the various advantages of the above embodiments will be described.

Effect 1: The embodiment describes a reflection mirror 27 mounted on a carriage 20 which reflects a laser beam launched by the semiconductor laser LD as a first irradiation beam Le1 which irradiates a series of first irradiated positions P1 of the liquid film FL. Then, the concave mirror 29 mounted on the carriage 20 receives scattered reflection Lr of the first irradiation beam Le1 from the first irradiated position P1 and then irradiates a second irradiation beam Le2 to the liquid film FL at the second irradiated position P2.

Therefore, the embodiment is able to more efficiency dry of the liquid film FL since the scattered reflection Lr reflected by the liquid film FL is irradiated again onto the liquid film FL. As a result, the embodiment prevents situations where the droplets Fb are insufficiently dried, eliminating cases of the poor formation of the element patterns 5F and the wiring patterns 6F.

Effect 2: In the embodiment a reflection mirror 27 and the concave mirror 29 respectively irradiate the first irradiation beam Le1 and the second irradiation beam Le2, with both of the two beams converging in the scanning direction (in direction Y). This further enhances the drying efficiency of the droplets insomuch as the first irradiation beam Le1 and the second irradiation beam Le2 both converge in the scan direction. Thus, it allows poor formation of the patterns to be eliminated even more certainly.

Effect 3: The embodiment specifies that the carriage 20 is mounted with the discharging head 21, the semiconductor laser LD, the cylindrical lens 25, the reflection mirror 27 and the concave mirror 29. One advantage of the invention is that it allows the positions of the first irradiation beam Le1 to be maintained as well as allowing the positions of the second irradiation beam Le2 to be maintained relative to the landing positions P of the droplet Fb (the liquid film FL). As a result, the first irradiation beam Le1 and the second irradiation beam Le2 can be irradiated onto the first irradiated positions P1 and the second irradiated positions P2 of the liquid film FL, respectively, with a higher reproducibility. This stabilizes the drying state of the element patterns 5F and the wiring patterns 6F, thereby reducing cases of poor formation of the circuit elements 5 and the internal wirings 6.

Effect 4: The embodiment specifies that the first irradiated positions P1 irradiated by the first irradiation beam Le1 and the second irradiated positions P2 irradiated by the second irradiation beam Le2 are located at different positions in the scan direction. Consequently, the liquid film FL can be irradiated with a laser beam twice in the process of scanning of the droplets Fb. Moreover, even in the case where the second irradiation beam Le2 is reflected from the liquid level FLa, the second irradiation beam Le2 is prevented from entering into the semiconductor laser LD. As a result, the embodiment stabilizes the irradiating operation of the laser beam. Thus, the drying efficiency of the droplets Fb can be improved and recreated with improved reproducibility.

Effect 5: The embodiment specifies that the reflection mirror 27 and the concave mirror 29 respectively irradiates the first irradiation beam Le1 and the second irradiation beam Le2 onto the region of the liquid film FL facing the discharging head 21, in a direction which is tangential to the pattern forming surface 4Sa, along a path that is located approximately along the Y direction. Therefore, the drying efficiency of the droplets Fb right after landing is improved, thereby permitting increased amount of freedom in the shape and size of the liquid film FL.

The above embodiment may be modified in such a manner as described below.

(1) In the embodiment, the concave mirror 29 is materialized in a cylindrical mirror having a curvature in the X direction. However, the concave mirror 29 may be one having a curvature as observed in the Z direction (e.g. a spherical mirror), where the scattered reflection Lr is reflected along a path which is tangential to the pattern forming surface 4Sa (approximate scan direction) and converges in the region of the droplets Fb.

In this case, it is preferable that the curvature radius of the concave mirror 29 in the Z direction is the same as the distance between the concave mirror 29 and the reflection mirror 27.

This allows the scattered reflection Lr, having been either reflected or scattered from the region of the droplets Fb, to be more efficiently collected. Moreover, the first irradiation beam Le1 from the reflection mirror 27, having been collected from the region of the droplets Fb, can be reflectively irradiated again more certainly onto the region of the droplets Fb.

(2) The embodiment specifies that the plurality of nozzles N be arranged in one array extending along direction X. However, the plurality of nozzles may be arranged in two or more arrays extending along direction X.

In the case of two arrays, the first irradiated position P1 may be set near the landing position corresponding to one of the arrays of nozzles, while the second irradiated position P2 may be set near the landing position corresponding to another set of the array of nozzles. This allows the droplets Fb, having landed on different landing positions, to be irradiated with a laser beam at approximately the same time. Consequently, the dried droplets Fb (patterns) can be made more uniform.

Alternatively, the focal distance of the concave mirror 29 may be made longer (or shorter) to extend the beam section of the second irradiated beam Le2, being formed on the liquid level FLa more toward the scanning direction, thereby allowing both the first irradiated position P1 and the second irradiated position P2 to be reflectively irradiated by the second irradiation beam Le2. This structure also prevents insufficient drying for the droplets Fb landing on different landing positions.

(3) The embodiment reflects the second irradiation means using one concave mirror 29, but the second irradiation means may in the form of a plurality of concave mirrors 29. Namely, the scattered reflection Lr of the first irradiation beam Le1 irradiated onto the liquid film FL may be reflectively irradiated by a plurality of the concave mirrors 29. Alternatively, the reflection of the second irradiation beam Le2 irradiated onto the liquid film FL may be reflectively irradiated by another concave mirror 29.

(4) The embodiment reflects the second irradiation means in the form of a concave mirror 29. However, it may reflected using any number of configurations, including a planar mirror, a prism mirror, or the like. That is, the second irradiation means may be any configuration capable of reflectively irradiating the laser beam that has been either reflected or scattered from the region of the droplets back onto the region of the droplets.

(5) The embodiment comprises a first irradiation means in the form of a cylindrical lens 25 and a reflection mirror 27. However, the first irradiation means may be made only with the cylindrical lens 25, with the laser beam launched by the cylindrical lens 25 being directly irradiated onto the liquid film FL.

(6) The embodiment presents a structure in which the first irradiation beam Le1 and the second irradiation beam Le2 are irradiated onto the liquid film FL. However, the structure may be one in which the first irradiation beam Le1 is irradiated onto the droplets Fb before they form a liquid film FL and the second irradiation beam Le2 is irradiated onto the droplets Fb after they have formed a liquid film FL. Alternatively, the structure may be one in which the first irradiation beam Le1 and the second irradiation beam Le2 are irradiated onto the droplets Fb before they form the liquid film FL, thereby forming a semispherical pattern. Namely, the structure may be any if only it allows the first irradiation beam Le1 and the second irradiation beam Le2 to be irradiated onto the region of the droplets that have landed on the substrate.

(7) The embodiment presents a structure in which the first irradiation beam Le1 is irradiated onto the region of the liquid film FL (droplets Fb) and the scattered reflection from the liquid film FL is reflectively irradiated as the second irradiation beam Le2. However, the structure may be one in which part of the first irradiation beam Le1 is irradiated onto the pattern forming surface 4Sa and the reflection from the pattern forming surface 4Sa is reflectively irradiated as the second irradiation beam Le2.

(8) The embodiment presents a structure in which the second irradiated positions P2 are set at some distance in the scan direction from the first irradiated positions P1. However, the second irradiated positions P2 may be set at some distance in the scanning direction from the first irradiated positions P1. Alternatively, the first irradiated positions P1 and the second irradiated positions P2 may be set at the same location.

(9) The embodiment presents a structure in which the first irradiation beam Le1 and the second irradiation beam Le2 are each irradiated onto a liquid film FL composed of a plurality of the droplets Fb. However, the structure may be one in which, a laser beam from the semiconductor laser LD is divided so as to correspond to each nozzle N in order to create a plurality of first irradiation beams Le1 and a plurality of second irradiation beams Le2. Alternatively, it may be one in which the same number of semiconductor lasers LD as the number of the nozzles N are used to irradiate the plurality of first irradiation beams Le1 and the plurality of second irradiation beams Le2 onto the liquid film FL (droplets Fb).

(10) The embodiment presents a structure in which the liquid film FL (droplets Fb) are dried by the first irradiation beam Le1 and the second irradiation beam Le2. However, the structure may be one in which the liquid film FL (droplets Fb) is dried using the first irradiation beam Le1 and the second irradiation beam Le2.

(11) The embodiment specifies that the concave mirror 29 mounted on the carriage 20 is used to irradiate the second irradiated positions P2 on the liquid film FL using the scattered reflection from the first irradiated positions P1 as the second irradiation beam Le2, the first and second irradiation beams Le1 and Le2 collaborating to dry the liquid film FL (droplets Fb).

As an alternative, the second irradiation means, which is placed at a position which is symmetrical to the first irradiation means with respect to the discharging head 21, may have an adjustable mirror 29 so as to irradiate the scattered reflection Lr as the second irradiation beam Le2 again onto the first irradiated positions P1 of the liquid film FL. This allows the liquid film FL (droplets Fb) at the first irradiated positions P1 to be dried through the combination of the first irradiation beam Le1 and the second irradiation beam Le2.

This structure allows the first irradiated positions P1 of the liquid film FL to be irradiated by both the first irradiation beam Le1 and the second irradiation beam Le2 from different directions. This offsets the kinetic momentums of the tangential paths of the first irradiation beam Le1 and the second irradiation beam and keeps the liquid film FL (droplets Fb) from moving. This allows the kinetic energy of both the first irradiation beam Le1 and the second irradiation beam Le2 to be efficiently converted into thermal energy, which results speedy drying with low cost and high efficiency.

(12) The embodiment presents a structure in which the bitmap data BMD is created based on the writing data Ia. However, the structure may be one in which the bitmap data BMD that has already been created by an external unit are inputted from the input unit 41 to the control unit 40.

(13) The embodiment describes the droplet discharging head 21 as a droplet discharging head of the piezoelectric element drive system. However, the droplet discharging head may be a discharging head of the resistance heating system or the electrostatic drive system.

(14) The embodiment presents a structure in which the circuit elements 5 and the internal wirings 6 are formed using the inkjet method. However, the structure may be one in which only those circuit elements 5 and internal wirings 6 that are comparatively minute are formed using the inkjet method.

(15) The embodiment describes a metal ink pattern forming material. However, the pattern forming materials may be any liquid body that is dispersed with insulation materials or organic materials. Namely, the pattern forming material may be any which is capable of being dried using a laser beam in order to form a solid phase pattern.

(16) The embodiment describes patterns in the form of the element patterns 5F and the wiring patterns 6F. However, the patterns may form various metal wirings included in liquid crystal displays, organic electroluminescence displays, field effect displays (FED, SED and the like) having a planate electron-releasing element and so on. Alternatively, the pattern may form identification codes composed of a plurality of linear patterns or dotted patterns. Namely, the pattern may be any pattern which is formed of dried droplets.

What is claimed is:
1. A droplet discharging device comprising:
a droplet discharging head that discharges a droplet of pattern forming material onto a substrate;
a first irradiation means that irradiates a laser beam launched by a laser source onto the region of the droplet discharged on the substrate; and a second irradiation means that reflectively irradiates the portions of the laser beam that have been either reflected or scattered from the region of the droplet back onto the region of the droplet;

wherein the second irradiation means is disposed opposite to the first irradiation means and includes a mirror that reflectively irradiates the portions of the laser beam that have been either reflected or scattered from the region of the droplet back onto the region of the droplet again, the droplet discharging head being disposed in between the first and second irradiation means.

2. The droplet discharging device according to claim 1, wherein the mirror has a concave surface that converges the portions of the laser beam that have been either reflected or scattered from the region of the droplet and reflects the portions of the laser beam onto the region of the droplet again.

3. The droplet discharging device according to claim 2, wherein:

the first irradiation means irradiates the laser beam launched by the laser source onto the region of the droplet along a path which is tangential to the substrate;

the second irradiation means includes a mirror that reflectively irradiates the laser beam, having been either reflected or scattered from the region of the droplet, along a path which is tangential to the substrate back onto the region of the droplet; and the mirror has a concave with a curvature radius that is approximately equivalent to the distance between the first irradiation means and the mirror.

4. The droplet discharging head according to claim 1, wherein the mirror has a concave surface facing the region of the droplet which converges the portions of the laser beam which have been reflected or scattered from the region of the droplet and reflects them onto the region of the droplet again.

5. The droplet discharging device according to claim 4, wherein the mirror irradiates the laser beam back onto the droplet again in such a manner that the laser beam that is irradiated onto the reflecting position via the mirror and the laser beam irradiated by the first irradiation means have offsetting kinetic momentum.

6. The droplet discharging device according to claim 1, wherein the pattern forming material is a metal ink that is dispersed with fine metal particle and the substrate is a low temperature co-fired ceramics substrate.

7. A droplet discharging device comprising:

a droplet discharging head that discharges a droplet of pattern forming material onto a substrate;

a first irradiation means that irradiates a laser beam launched by a laser source onto the region of the droplet discharged on the substrate; and a second irradiation means that reflectively irradiates the portions of the laser beam that have been either reflected or scattered from the region of the droplet back onto the region of the droplet;

a carriage that is mounted to the droplet discharging head, the first irradiation means, and the second irradiation means; and a scanning unit that scans the substrate along scanning direction relative to the carriage.

8. The droplet discharging device according to claim 7, wherein:

the first irradiation means irradiates the laser beam launched by the laser source onto a first irradiated position; and the second irradiation means includes a mirror that reflectively irradiates the portions of the laser beam that have been either reflected or scattered from the region of the droplet onto a second irradiated position that is locate at a different position in the scanning direction from the first irradiated position.

* * * * *